(12) United States Patent
Iwata

(10) Patent No.: US 9,543,340 B2
(45) Date of Patent: Jan. 10, 2017

(54) PHOTOELECTRIC CONVERSION DEVICE AND METHOD OF MANUFACTURING PHOTOELECTRIC CONVERSION DEVICE

(71) Applicant: CANON KABUSHIKI KAISHA, Tokyo (JP)

(72) Inventor: Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/017,745

(22) Filed: Feb. 8, 2016

(65) Prior Publication Data

US 2016/0247843 A1    Aug. 25, 2016

(30) Foreign Application Priority Data

Feb. 20, 2015   (JP) ................................. 2015-031380

(51) Int. Cl.
H01L 21/8238     (2006.01)
H01L 27/146      (2006.01)

(52) U.S. Cl.
CPC ... *H01L 27/14603* (2013.01); *H01L 27/14643* (2013.01); *H01L 27/14689* (2013.01)

(58) Field of Classification Search
CPC ........... H01L 27/14603; H01L 27/1643; H01L 27/14689
See application file for complete search history.

(56) References Cited

U.S. PATENT DOCUMENTS

| | | | |
|---|---|---|---|
| 8,031,250 B2 | 10/2011 | Yamashita | |
| 8,648,944 B2 | 2/2014 | Iwata | |
| 8,697,500 B2 * | 4/2014 | Iwata | H01L 27/1461 257/291 |
| 2002/0109160 A1 | 8/2002 | Mabuchi et al. | |
| 2008/0142856 A1 | 6/2008 | Sato et al. | |
| 2010/0025569 A1 * | 2/2010 | Matsumoto | H01L 27/14609 250/208.1 |
| 2010/0224766 A1 | 9/2010 | Tateshita | |
| 2011/0136291 A1 | 6/2011 | Iwata et al. | |

FOREIGN PATENT DOCUMENTS

| | | |
|---|---|---|
| JP | 2002-217397 | 8/2002 |
| JP | 5016941 | 9/2012 |

OTHER PUBLICATIONS

U.S. Appl. No. 14/929,543, filed Nov. 2, 2015, Hiroki Hiyama.

\* cited by examiner

*Primary Examiner* — Dung Le
(74) *Attorney, Agent, or Firm* — Fitzpatrick, Cella, Harper & Scinto

(57) ABSTRACT

A photoelectric conversion device includes a pixel including a transfer transistor transferring signal charges generated in a photoelectric conversion portion from a charge accumulation region to a floating diffusion region, and a peripheral transistor forming a peripheral circuit for controlling a read-out operation of a pixel signal based on the signal charges from the pixel. A gate electrode of the transfer transistor and the floating diffusion region are separated from each other by a first distance in a plan view. A gate electrode and a drain region of the peripheral transistor are separated from each other by a second distance smaller than the first distance in a plan view.

7 Claims, 7 Drawing Sheets

PHOTOELECTRIC CONVERSION DEVICE AND METHOD OF MANUFACTURING PHOTOELECTRIC CONVERSION DEVICE

BACKGROUND OF THE INVENTION

Field of the Invention

The present invention relates to a photoelectric conversion device and a method of manufacturing the photoelectric conversion device.

Description of the Related Art

In a photoelectric conversion device for detecting light information by a photoelectric conversion element, it is important to suppress a dark current which flows into the photoelectric conversion element in order to reduce a noise component which is superimposed to signal charges.

Japanese Patent Application Laid-Open No. 2002-217397 proposes a method whereby in order to reduce a dark current which flows into a photodiode as a photoelectric conversion element, a negative voltage is applied to a gate electrode of a transfer transistor during a charge accumulation period in the photoelectric conversion element. According to such the method, since a channel of hole is formed in an interface between an oxide film and a semiconductor substrate under the gate electrode of the transfer transistor serving as a source of the dark current, the generation of the dark current can be suppressed. On the other hand, according to the method disclosed in Japanese Patent Application Laid-Open No. 2002-217397, since a potential difference between the gate electrode of the transfer transistor and a floating diffusion region is large, there is a risk that in association with a deterioration in a gate insulating film of the transfer transistor, a reliability to insulating performance of the relevant portion decreases remarkably.

Japanese Patent No. 5016941 proposes a method whereby a negative voltage is applied to a gate electrode of a transfer transistor during a charge accumulation period in a photoelectric conversion element and a voltage of a floating diffusion region is set to a value lower than a power supply voltage. According to this method, since an electric field which is applied between the gate electrode of the transfer transistor and the floating diffusion region is reduced during the charge accumulation period, a deterioration in a gate insulating film in the relevant portion can be suppressed.

However, according to the method disclosed in Japanese Patent No. 5016941, by setting the voltage of the floating diffusion region to the value lower than the power supply voltage, a ratio at which charges overflowed from a photodiode during the charge accumulation period leak into an adjacent pixel is larger than a ratio at which such charges are moved to the floating diffusion region. Thus, there is a case where leakage characteristics into the adjacent pixel deteriorate.

SUMMARY OF THE INVENTION

It is an aspect of the present invention to provide a photoelectric conversion device which can realize both of an improvement of a reliability of a gate insulating film of a transfer transistor and a suppression of a leakage into an adjacent pixel and a method of manufacturing the photoelectric conversion device.

According to an aspect of the present invention, there is provided a photoelectric conversion device including a pixel including a transfer transistor transferring signal charges generated in a photoelectric conversion portion from a charge accumulation region to a floating diffusion region, and a peripheral transistor forming a peripheral circuit for controlling a read-out operation of a pixel signal based on the signal charges from the pixel, wherein a gate electrode of the transfer transistor and the floating diffusion region are separated from each other by a first distance in a plan view, and a gate electrode and a drain region of the peripheral transistor are separated from each other by a second distance smaller than the first distance in a plan view.

According to another aspect of the present invention, there is provided a method of manufacturing a photoelectric conversion device including a pixel including a transfer transistor transferring signal charges generated in a photoelectric conversion portion from a charge accumulation region to a floating diffusion region, and a peripheral transistor forming a peripheral circuit for controlling a read-out operation of a pixel signal based on the signal charges from the pixel, including forming a gate electrode of the transfer transistor and a gate electrode of the floating diffusion region over a semiconductor substrate, forming the floating diffusion region in the semiconductor substrate so as to be separated from the gate electrode of the transfer transistor by a first distance in a plan view, and forming a drain region of the peripheral transistor in the semiconductor substrate so as to be separated from the gate electrode of the peripheral transistor by a second distance smaller than the first distance in a plan view.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A photoelectric conversion device and a method of manufacturing the same according to a first embodiment of the present invention will be described with reference to FIGS. 1 to 2H.

Figure 1:
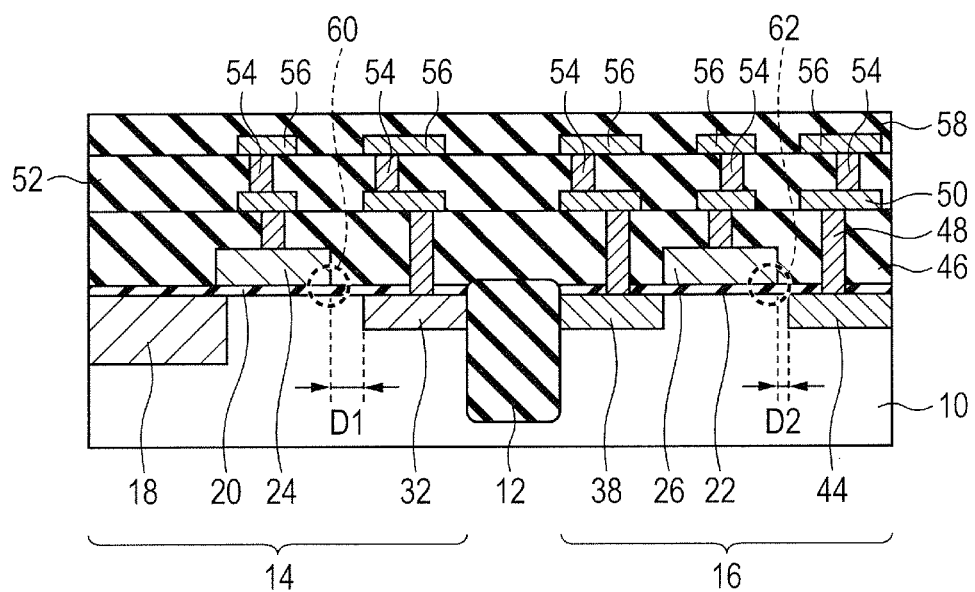
FIG. 1 is a cross-sectional view illustrating a structure of a photoelectric conversion device according to a first embodiment of the present invention.

FIG. 1 is a schematic cross-sectional view illustrating a structure of the photoelectric conversion device according to the present embodiment. FIGS. 2A to 2H are cross-sectional views illustrating the method of manufacturing the photoelectric conversion device according to the present embodiment.

First, the structure of the photoelectric conversion device according to the present embodiment will be described with reference to FIG. 1.

The photoelectric conversion device according to the present embodiment includes a pixel region in which a plurality of pixels are arranged in a two-dimensional array form, and a peripheral circuit region in which a circuit for controlling the read-out operation of a pixel signal based on signal charges obtained in the pixel region and the like are arranged. Among circuit elements formed in the pixel region and the peripheral circuit region, a transfer transistor forming a part of a pixel read-out circuit and a typical transistor (hereinbelow, referred to as "peripheral transistor") arranged in the peripheral circuit region are illustrated.

An element isolation insulating region 12 which defines active regions is formed in a semiconductor substrate 10. In FIG. 1, the active region existing on the left side of the element isolation insulating region 12 is a transfer transistor forming region 14 and the active region existing on the right side of the element isolation insulating region 12 is a peripheral transistor forming region 16. In FIG. 1, the transfer transistor forming region 14 and the peripheral transistor forming region 16 are illustrated so as to be arranged in the adjacent active regions with the element isolation insulating region 12 interposed therebetween for convenience of description. However, those regions are not necessarily arranged so as to be adjacent to each other with the element isolation insulating region 12 interposed therebetween.

A charge accumulation region 18 and a floating diffusion region 32 are formed in a surface portion of the transfer transistor forming region 14 of the semiconductor substrate 10 so as to be separated from each other. A gate electrode 24 is formed over the semiconductor substrate 10 between the charge accumulation region 18 and the floating diffusion region 32 through a gate insulating film 20. Thus, a transfer transistor including the gate electrode 24, the charge accumulation region 18, and the floating diffusion region 32 is provided in the transfer transistor forming region 14. In an example, the charge accumulation region 18 corresponds to a source region of the transfer transistor and the floating diffusion region 32 corresponds to a drain region of the transfer transistor. There is a case where denominations of the source and drain of the transistor are exchanged in dependence on a conductivity type of such a region or a function to which attention is paid.

The transfer transistor is a MOS transistor formed in the pixel to transfer the signal charges generated in the photoelectric conversion portion to the floating diffusion region 32. In an example, the charge accumulation region 18 is one diffusion region forming a pn junction of a photodiode serving as a photoelectric conversion element. In this case, photocharge generated in the photodiode formed of the charge accumulation region 18 and the semiconductor substrate (well) 10 are accumulated in the charge accumulation region 18. The charge accumulation region 18 may be a diffusion region of a charge holding portion for temporarily holding the signal charges transferred from the photoelectric conversion element.

The gate electrode 24 of the transfer transistor and the floating diffusion region 32 are separated from each other by a separation distance D1. The separation distance D1 is a distance between the gate electrode 24 and the floating diffusion region 32 when viewing as a plan view. It is also possible to consider that the separation distance is a distance in the horizontal direction between the gate electrode 24 and the floating diffusion region 32. In this specification, it is assumed that the horizontal direction denotes a direction parallel to the surface of the semiconductor substrate 10. By using such a structure in which the gate electrode 24 and the floating diffusion region 32 are separated from each other (D1>0), electric field concentration between the gate electrode 24 of the transfer transistor and the floating diffusion region 32 can be reduced. Particularly, since electric field concentration of a portion (portion 60 surrounded by a broken line) near the gate insulating film 20 of an edge portion of the gate electrode 24 of the transfer transistor is reduced, a deterioration of the gate insulating film 20 is suppressed and the reliability to insulating performance of such a portion can be maintained.

Thus, an upper limit value of a voltage which is applied between the gate electrode 24 and the floating diffusion region 32 and is necessary to guarantee desired insulating reliability to the gate insulating film 20 can be increased. Therefore, during a charge accumulation period, even when such a driving as to apply a power supply voltage to the floating diffusion region 32 while applying a negative voltage to the gate electrode 24 of the transfer transistor is performed, by properly setting the isolation distance D1, the reliability of the gate insulating film 20 can be maintained. Consequently, both of the reduction of the dark current flowing into the photodiode and the reduction of the charges which leak into the adjacent pixel can be accomplished.

Generally, the smaller the separation distance D1 is, the more the electric field concentration between the gate electrode 24 of the transfer transistor and the floating diffusion region 32 becomes remarkable and, the larger the separation distance D1 is, the more the transfer performance deteriorates. Therefore, when the transfer transistor is designed, it is desirable that after the separation distance D1 was set to such a value that at least the electric field concentration at the time of applying an operation voltage for the charge accumulation period is suppressed and the reliability of the gate insulating film 20 can be assured, the transfer performance is designed in accordance with such a structure.

On the other hand, a source region 38 and a drain region 44 are formed in the surface portion of the peripheral transistor forming region 16 of the semiconductor substrate 10 so as to be separated from each other. A gate electrode 26 is formed over the semiconductor substrate 10 between the source region 38 and the drain region 44 through a gate insulating film 22. A peripheral transistor including the gate electrode 26, the source region 38, and the drain region 44 is provided in the peripheral transistor forming region 16.

The gate electrode 26 and the drain region 44 of the peripheral transistor are separated from each other by a separation distance D2. The separation distance D2 is a shortest distance between the gate electrode 26 and the drain region 44 when viewing as a plan view. It is also possible to consider that the separation distance is a distance in the horizontal direction between the gate electrode 26 and the drain region 44. Also in the case of the peripheral transistor, in a manner similar to the case of the transfer transistor, the smaller the separation distance D2 is, the more electric field concentration between the gate electrode 26 and the drain region 44 becomes remarkable and, the larger the separation distance D2 is, the more a driving capability deteriorates. In the peripheral transistor, it is desirable that the separation distance D2 is small in order to attach importance to a suppression of fluctuations of the driving capability and the performance of the element. An operation voltage of the typical peripheral transistor is a ground voltage and a power supply voltage. It is considered that an electric potential difference like an operation voltage which is applied to the transfer transistor during the charge accumulation period does not occur between the gate electrode 26 and the drain region 44. Therefore, the separation distance D2 can be set to be smaller than the separation distance D1 and the deterioration of the driving capability can be minimized. In the typical MOS transistor, generally, larger importance is attached to the suppression of the fluctuations of the driving capability and the performance of the element, and a source region and a drain region are formed in self-alignment with the gate electrode 26. There is also a case where the separation distance D2 is set to 0 or a minus value. A case where the separation distance D2 is set to a minus value corresponds to a state where a part of the gate electrode and a part of the drain region overlap when viewing as a plan view.

That is, in the photoelectric conversion device, by setting a relation of (D1>D2), a leakage to the adjacent pixel can be suppressed while maintaining the reliability of the gate insulating film 20 of the transfer transistor. Further, the reliability of the gate insulating film 20 can be improved without remarkably reducing an operation speed of the peripheral transistor.

Impurity concentration of the floating diffusion region 32 of the transfer transistor is not more than impurity concentration of the drain region 44 of the peripheral transistor. That is, assuming that the impurity concentration of the floating diffusion region 32 of the transfer transistor is equal to $Nd_1$ and the impurity concentration of the source region 38 and the drain region 44 of the peripheral transistor is equal to $Nd_2$, there is a relation of ($Nd_2 \geq Nd_1$). This is because if the floating diffusion region 32 of the impurity concentration of a level which is almost equal to the impurity concentration necessary to assure the driving capability of the peripheral transistor is formed, the electric field concentration between the gate electrode 24 of the transfer transistor and the floating diffusion region 32 becomes remarkable. In addition, it is because a capacitance of the floating diffusion region 32 increases, so that noise characteristics of the pixel portion deteriorate remarkably. Therefore, it is desirable to set the impurity concentration $Nd_1$ of the floating diffusion region 32 to a value which is not more than the impurity concentration $Nd_2$ of the source region 38 and the drain region 44 of the peripheral transistor.

As an example, it is assumed that the impurity concentration $Nd_1$ lies within a range from $1 \times 10^{17}$ cm$^{-3}$ to $1 \times 10^{19}$ cm$^{-3}$ and the impurity concentration $Nd_2$ lies within a range from $1 \times 10^{18}$ cm$^{-3}$ to $1 \times 10^{21}$ cm$^{-3}$.

The peripheral transistor may have an LDD structure or an extension structure. In this case, the separation distance D2 is a separation distance between the gate electrode 26 and an LDD region or an extension region. The impurity concentration $Nd_2$ of the drain region 44 is impurity concentration of the LDD region or the extension region. Similarly, the floating diffusion region 32 may have a structure in which the LDD region or the extension region is formed in an edge portion on the gate electrode 24 side. In this case, the separation distance D1 is a separation distance between the gate electrode 24 and the LDD region or the extension region. The impurity concentration $Nd_1$ of the floating diffusion region 32 is impurity concentration of the LDD region or the extension region.

Subsequently, a method of manufacturing the photoelectric conversion device according to the present embodiment will be described with reference to FIGS. 2A to 2H.

Figure 2A:
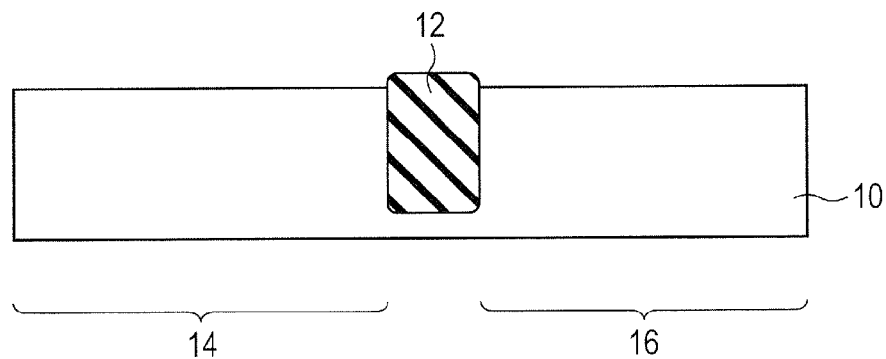
FIGS. 2A, 2B, 2C, 2D, 2E, 2F, 2G and 2H are cross-sectional views illustrating a method of manufacturing the photoelectric conversion device according to the first embodiment of the present invention.

First, the element isolation insulating region 12 is formed in the surface portion of the semiconductor substrate 10 by, for example, an STI (Shallow Trench Isolation) method or an LOCOS (Local Oxidation of Silicon) method (FIG. 2A). As an example, the element isolation insulating region 12 formed by the STI method is illustrated in the drawings. In FIG. 2A, it is assumed that the active region existing on the left side of the element isolation insulating region 12 is the transfer transistor forming region 14 and the active region existing on the right side of the element isolation insulating region 12 is the peripheral transistor forming region 16.

Figure 2B:
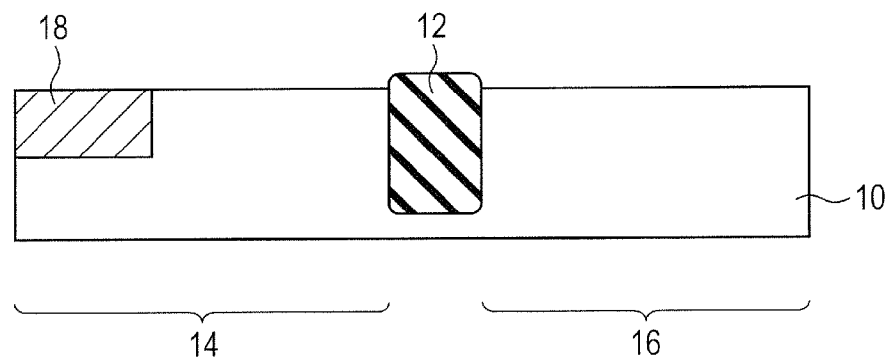

Subsequently, a photoresist pattern (not illustrated) having an opening is formed in the forming region of the charge accumulation region 18 by photolithography. After that, ion implantation is performed by using the photoresist pattern as a mask to form the charge accumulating region 18 (FIG. 2B). After the charge accumulation region 18 is formed, the photoresist pattern used as the mask is removed by ashing or the like. Strictly speaking, the charge accumulation region 18 is formed since the implanted impurities are electrically activated by a thermal treatment which is performed later. However, in this instance, it is assumed that a diffusion region before the thermal treatment is also called a charge accumulation region 18 for convenience of explanation. This is true of the floating diffusion region 32, source region 38, and drain region 44, which will be described hereinafter.

Subsequently, the gate insulating film 20 of the transfer transistor is formed on the surface portion of the semiconductor substrate 10 in the transfer transistor forming region 14 by, for example, a thermal oxidation method, CVD (chemical vapor deposition) method, or the like. Similarly, the gate insulating film 22 of the peripheral transistor is formed on the surface portion of the semiconductor substrate 10 in the peripheral transistor forming region 16.

Figure 2C:
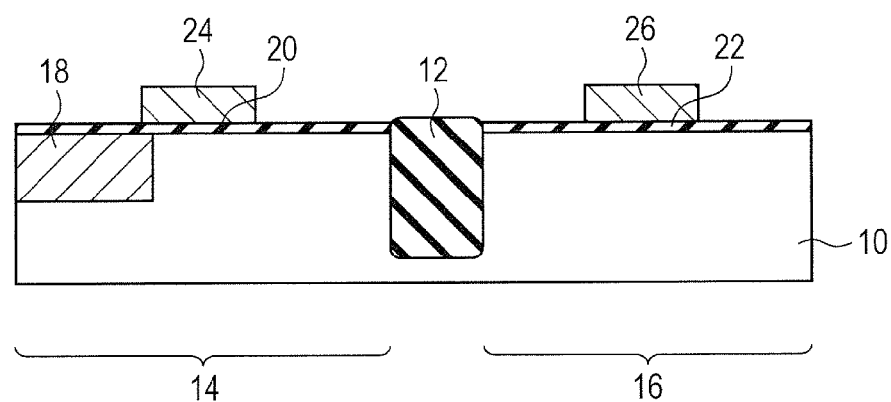

Subsequently, a conductive film is deposited over the semiconductor substrate 10 on which the gate insulating films 20 and 22 are formed. After that, the conductive film is patterned by photolithography and etching and the gate electrodes 24 and 26 are formed (FIG. 2C). The gate electrode 24 on the gate insulating film 20 is a gate electrode of the transfer transistor. The gate electrode 26 on the gate insulating film 22 is a gate electrode of the peripheral transistor. The charge accumulation region 18 may be formed after the gate electrodes 24 and 26 are formed.

Subsequently, a photoresist pattern 28 having an opening 30 is formed in the forming region of the floating diffusion region 32 of the pixel by photolithography. At this time, it is assumed that the photoresist pattern 28 has such a shape that it covers the whole upper portion of the gate electrode 24 of the transfer transistor and an edge portion of the opening 30 on the gate electrode 24 side is away from the gate electrode 24 by a predetermined distance.

Figure 2D:
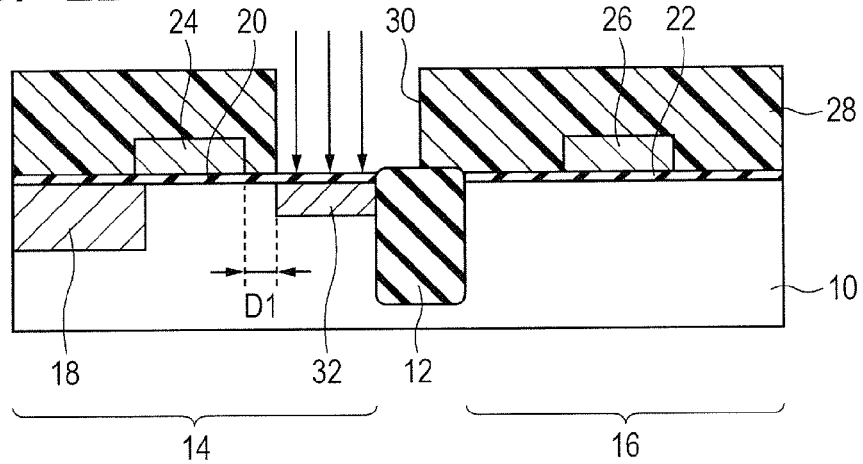

Subsequently, ion implantation is performed by using the photoresist pattern 28 as a mask to form the floating diffusion region 32 (FIG. 2D). Thus, the separation distance D1 between the gate electrode 24 of the transfer transistor and the floating diffusion region 32 is equal to a distance corresponding to a separation distance (foregoing predetermined distance) between the edge portion of the opening 30 on the gate electrode 24 side and the gate electrode 24. After the floating diffusion region 32 is formed, the photoresist pattern 28 is removed by ashing or the like.

Subsequently, a photoresist pattern 34 having an opening 36 formed in the forming region of the source region 38 of the peripheral transistor is formed by photolithography.

Figure 2E:
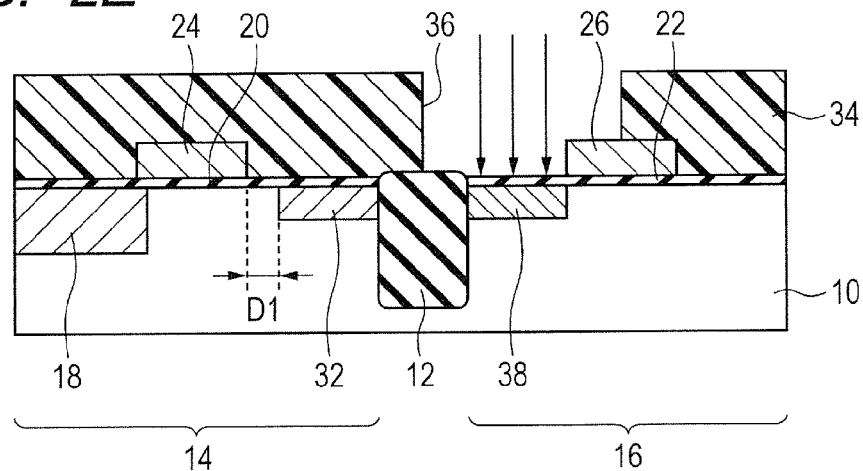

Subsequently, ion implantation is performed by using the photoresist pattern 34 and the gate electrode 26 as a mask to form the source region 38 of the peripheral transistor (FIG. 2E). After the source region 38 is formed, the photoresist pattern 34 is removed by ashing or the like.

Subsequently, a photoresist pattern 40 having an opening 42 formed in the forming region of the drain region of the peripheral transistor is formed by photolithography. At this time, it is assumed that the photoresist pattern 40 has such a shape that it covers the whole upper portion of the gate electrode 26 and an edge portion of the opening 42 on the gate electrode 26 side is away from the gate electrode 26 by a predetermined distance.

Figure 2F:
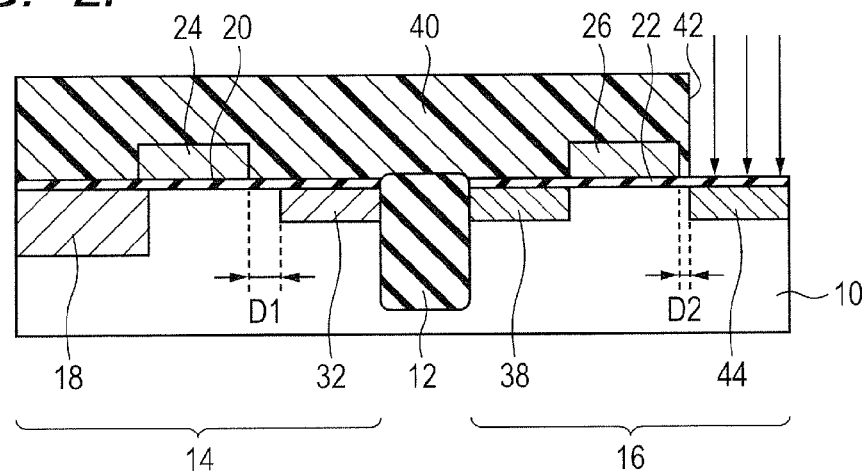

Subsequently, ion implantation is performed by using the photoresist pattern 40 as a mask to form the drain region 44 of the peripheral transistor (FIG. 2F). Thus, the separation distance D2 between the gate electrode 26 and the drain region 44 of the peripheral transistor is equal to a distance corresponding to a separation distance (foregoing predetermined distance) between the edge portion of the opening 42 on the gate electrode 26 side and the gate electrode 26. After the drain region 44 is formed, the photoresist pattern 40 is removed by ashing or the like.

Forming conditions of the floating diffusion region 32 and the drain region 44 are properly set in such a manner that there is a relation of (D1>D2) between the separation distance D1 and the separation distance D2 and there is a relation of ($Nd_1<Nd_2$) between the impurity concentration $Nd_1$ of the floating diffusion region 32 and the impurity concentration $Nd_2$ of the drain region 44.

As mentioned above, the peripheral transistor may have an LDD structure or an extension structure. In this case, the separation distance D2 is a separation distance between the gate electrode 26 and an LDD region or an extension region. Similarly, the floating diffusion region 32 may have a structure in which the LDD region or the extension region is formed in an edge portion on the gate electrode 24 side. In this case, the separation distance D1 is a separation distance between the gate electrode 24 and the LDD region or the extension region. In the case of forming the LDD structure or the extension structure, it is sufficient that a deep diffusion region provided with an offset larger than the separation distance D1 or D2 from the gate electrode 24 or 26 is further formed by using a side wall spacer or a photoresist pattern.

The order of performing the processing steps illustrated in FIGS. 2D, 2E, and 2F is not limited to that shown in the foregoing example but the steps can be performed in arbitrary order. In the case of forming the charge accumulation region 18 after the gate electrode 24 is formed, other processing steps including those steps can be also executed in arbitrary order.

In this manner, the transfer transistor including the charge accumulation region 18, the floating diffusion region 32, and the gate electrode 24 is formed in the transfer transistor forming region 14. The peripheral transistor including the source region 38, the drain region 44, and the gate electrode 26 is formed in the peripheral transistor forming region 16.

Subsequently, an insulating film is deposited by, for example, CVD method over the semiconductor substrate 10 in which the transfer transistor and the peripheral transistor are formed, a surface of the insulating film is planarized by CMP (chemical mechanical polishing) method in accordance with necessity, and an inter-layer insulating film 46 is formed.

Subsequently, contact plug 48 electrically connected to each terminal of the transfer transistor and the peripheral transistor is formed in the inter-layer insulating film 46.

Subsequently, a first interconnection layer 50 electrically connected to each terminal of the transfer transistor and the peripheral transistor through the contact plug 48 is formed over the inter-layer insulating film 46.

Figure 2G:
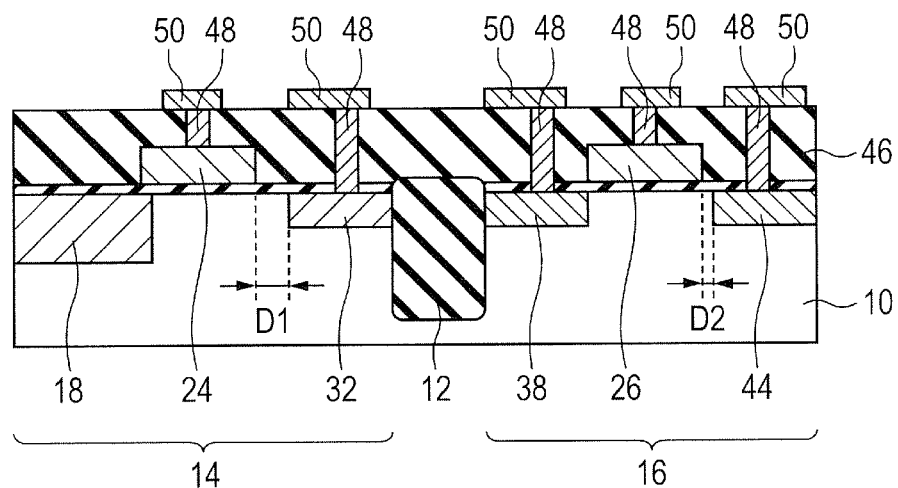
Figure 2H:
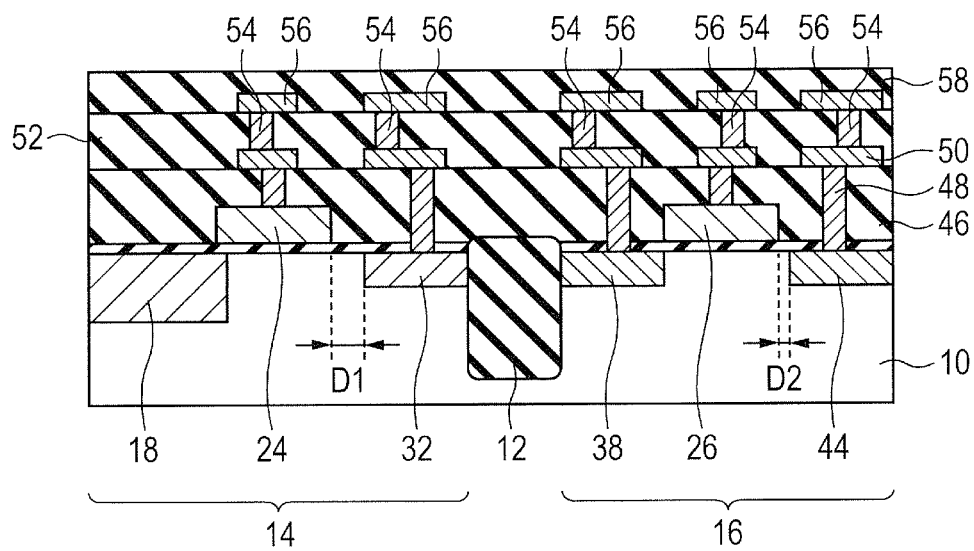

Similarly, an inter-layer insulating film 52, inter-layer via-plugs 54, a second interconnection layer 56, and an inter-layer insulating film 58 are formed over the inter-layer insulating film 46 on which the first interconnection layer 50 is formed (FIG. 2H).

After that, a necessary back-end process is further performed and the photoelectric conversion device according to the present embodiment is completed.

By using the manufacturing method of the present embodiment, the transfer transistor and the peripheral transistor having the relations of (D1>D2) and ($Nd_1<Nd_2$) can be formed. Therefore, according to the present embodiment, the transistor of the peripheral circuit portion which can suppress a leakage into the adjacent pixel and can perform the high-speed operation while maintaining the reliability of the gate insulating film of the transfer transistor can be used.

Second Embodiment

Figure 3A:
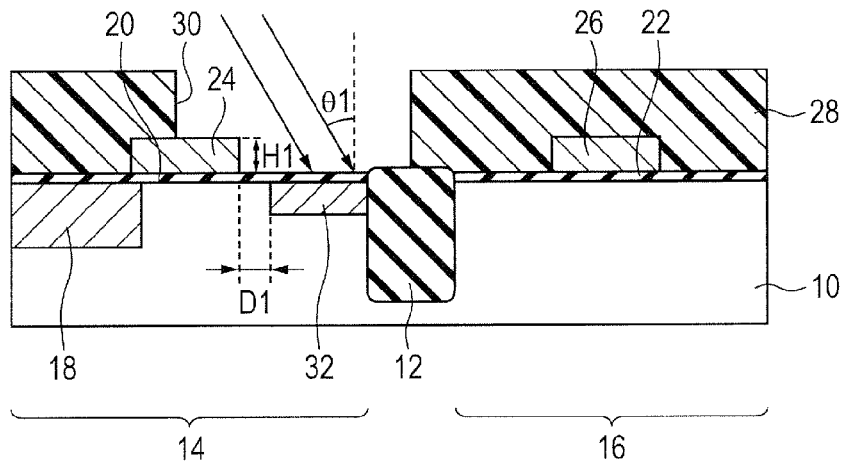
FIGS. 3A, 3B and 3C are cross-sectional views illustrating a method of manufacturing a photoelectric conversion device according to a second embodiment of the present invention.
Figure 3B:
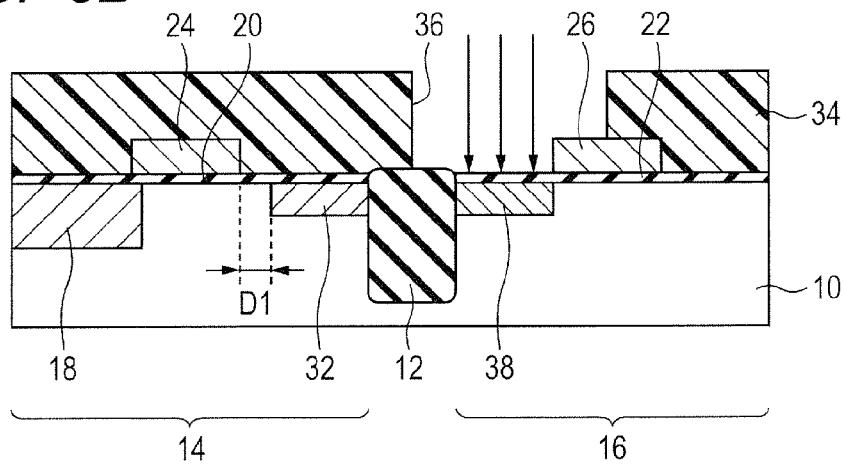
Figure 3C:
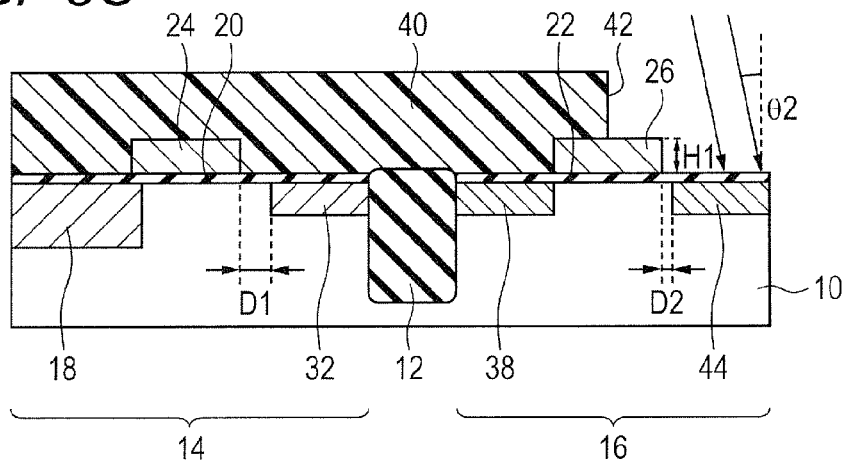

A method of manufacturing a photoelectric conversion device according to a second embodiment of the present invention will be described with reference to FIGS. 3A to 3C. Component elements similar to those in the photoelectric conversion device and the method of manufacturing the same according to the first embodiment illustrated in FIGS. 1 to 2H are designated by the same reference numerals or symbols and their description is omitted or will be simply made. FIGS. 3A to 3C are cross-sectional views illustrating the method of manufacturing the photoelectric conversion device according to the present embodiment.

In the present embodiment, another method of manufacturing the photoelectric conversion device according to the first embodiment illustrated in FIG. 1 will be described.

First, in a manner similar to the manufacturing method of the first embodiment illustrated in FIGS. 2A to 2C, the element isolation insulating region 12, the charge accumulation region 18, the gate insulating films 20 and 22, and the gate electrodes 24 and 26 are formed in/over the semiconductor substrate 10, respectively.

Subsequently, the photoresist pattern 28 having the opening 30 formed in the forming region of the floating diffusion region 32 is formed by photolithography. At this time, it is assumed that the photoresist pattern 28 has such a shape that one edge portion of the gate electrode 24 on the forming region side of the floating diffusion region 32 is exposed in the opening 30.

Subsequently, ion implantation is performed by using the photoresist pattern 28 and the gate electrode 24 as a mask to form the floating diffusion region 32. At this time, it is assumed that the incident direction of the impurity ions is a direction which is inclined to the normal direction of the semiconductor substrate 10, and the floating diffusion region 32 is formed while using shadowing effect by the gate electrode 24. In the photoresist pattern 28, a film thickness, a layout of the opening 30, and the like have been preset so as not to hide one edge portion of the gate electrode 24 on the forming region side of the floating diffusion region 32 when viewed from the incident direction of the impurity ions.

In the case where the gate electrode 24 is set to the center and two directions of the charge accumulation region 18 side and the floating diffusion region 32 side are considered, the direction which inclines the incident direction of the impurity ions is set to the charge accumulation region 18 side. To the normal direction of the semiconductor substrate 10, when a tilt angle is provided on the charge accumulation region 18 side and the impurity ions are implanted, since no impurity ions are implanted to a portion which becomes a shadow of the gate electrode 24, the floating diffusion region 32 is formed so as to be away from the edge portion of the gate electrode 24. By properly setting an angle of inclination (tilt angle θ1) of the incident direction of the impurity ions to the normal direction of the semiconductor substrate 10 in accordance with a height H1 of the gate electrode 24, the desired separation distance D1 can be provided between the gate electrode 24 and the floating diffusion region 32 (FIG. 3A). After the floating diffusion region 32 is formed, the photoresist pattern 28 is removed by ashing or the like.

According to the manufacturing method of the first embodiment whereby the separation distance D1 is specified by the position of the opening portion 30 of the photoresist pattern 28, an alignment precision between the gate electrode 24 and the photoresist pattern 28 exerts an influence on a variation in the separation distance D1. On the other hand, according to the manufacturing method according to the second embodiment, since the floating diffusion region 32 is formed in self-alignment with the gate electrode 24, the separation distance D1 is not influenced by a variation in manufacturing caused by photolithography. Consequently, a controllability of the separation distance D1 between the gate electrode 24 and the floating diffusion region 32 is remarkably improved.

As an example, the height H1 of the gate electrode 24 of the transfer transistor lies within a range from 0.1 μm to 0.5 μm and the tilt angle θ1 lies within a range from 26° to 45°.

Subsequently, the source region 38 of the peripheral transistor is formed (FIG. 3B) in a manner similar to the manufacturing method according to the first embodiment illustrated in FIG. 2E.

Subsequently, the photoresist pattern 40 having the opening 36 formed in the forming region of the drain region 44 is formed by photolithography. At this time, it is assumed that the photoresist pattern 40 has such a shape that one edge portion of the gate electrode 26 on the forming region side of the drain region 44 is exposed in the opening 36.

Subsequently, ion implantation is performed by using the photoresist pattern 40 and the gate electrode 26 as a mask to form the drain region 44. At this time, it is assumed that the incident direction of the impurity ions is set to a direction which is inclined to the normal direction of the semiconductor substrate 10, and the drain region 44 is formed while using shadowing effect by the gate electrode 26. In the photoresist pattern 40, a film thickness, a layout of the opening 42, and the like have been preset so as not to hide one edge portion of the gate electrode 26 on the forming region side of the drain region 44 when viewed from the incident direction of the impurity ions.

In the case where the gate electrode 26 is set to the center and two directions of the source region 38 side and the drain region 44 side are considered, the direction which inclines the incident direction of the impurity ions is set to the source region 38 side. To the normal direction of the semiconductor substrate 10, when a tilt angle is provided on the source region 38 side and the impurity ions are implanted, since no impurity ions are implanted to a portion which becomes a shadow of the gate electrode 26, the drain region 44 is formed so as to be away from the edge portion of the gate electrode 26. By properly setting an angle of inclination (tilt angle θ2) of the incident direction of the impurity ions to the normal direction of the semiconductor substrate 10 in accordance with a height H1 of the gate electrode 26, the desired isolation distance D2 can be provided between the gate electrode 26 and the drain region 44 (FIG. 3C). After the drain region 44 is formed, the photoresist pattern 40 is removed by ashing or the like.

According to the manufacturing method according to the first embodiment whereby the isolation distance D2 is specified by the position of the opening 42 of the photoresist pattern 40, an alignment precision between the gate electrode 26 and the photoresist pattern 40 exerts an influence on a variation in the separation distance D2. On the other hand, according to the manufacturing method according to the present embodiment, since the drain region 44 is formed in self-alignment with the gate electrode 26, the separation distance D2 is not influenced by a variation in manufacturing caused by photolithography. Consequently, a controllability of the separation distance D2 between the gate electrode 26 and the drain region 44 is remarkably improved.

As an example, the height H1 of the gate electrode 26 of the peripheral transistor lies within a range from 0.1 μm to 0.5 μm and the tilt angle θ2 lies within a range from 1° to 25°.

After that, in a manner similar to the manufacturing method according to the first embodiment illustrated in FIGS. 2G and 2H, a desired back-end process is performed and the photoelectric conversion device is completed.

By using the manufacturing method according to the present embodiment, in a manner similar to the case of the first embodiment, the transfer transistor and the peripheral transistor having the relation of (D1>D2) and the relation of (Nd$_1$<Nd$_2$) can be formed. Therefore, according to the present embodiment, the transistor of the peripheral circuit portion which can suppress a leakage into the adjacent pixel and can perform the high-speed operation while maintaining the reliability of the gate insulating film of the transfer transistor can be used. By forming the floating diffusion region 32 and the drain region 44 by using the oblique ion implantation, a controllability of the separation distances D1 and D2 can be improved and a variation of characteristics of the transistor can be reduced.

Third Embodiment

A photoelectric conversion device and a method of manufacturing the same according to a third embodiment of the present invention will be described with reference to FIGS. 4 to 5B. Component elements similar to those in the photoelectric conversion device and the method of manufacturing the same according to each of the first and second embodiments illustrated in FIGS. 1 to 3C are designated by the same reference numerals or symbols and their description is omitted or will be simply made. FIG. is a schematic cross-sectional view illustrating a structure of the photoelectric conversion device according to the present embodiment. FIGS. 5A and 5B are cross-sectional views illustrating the method of manufacturing the photoelectric conversion device according to the present embodiment.

First, the structure of the photoelectric conversion device according to the present embodiment will be described with reference to FIG. 4.

Figure 4:
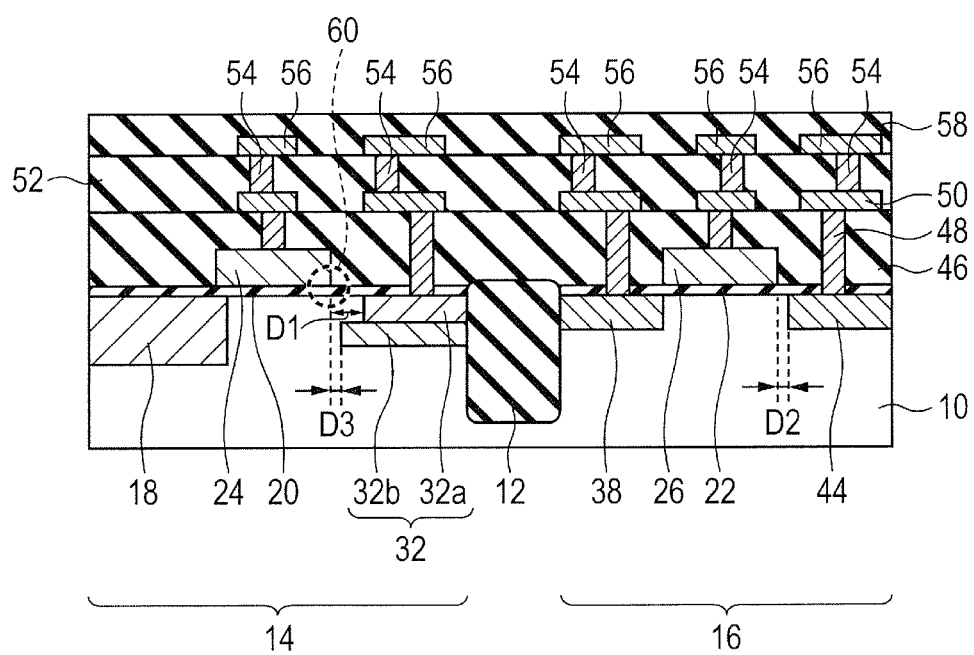
FIG. 4 is a cross-sectional view illustrating a structure of a photoelectric conversion device according to a third embodiment of the present invention.
Figure 5A:
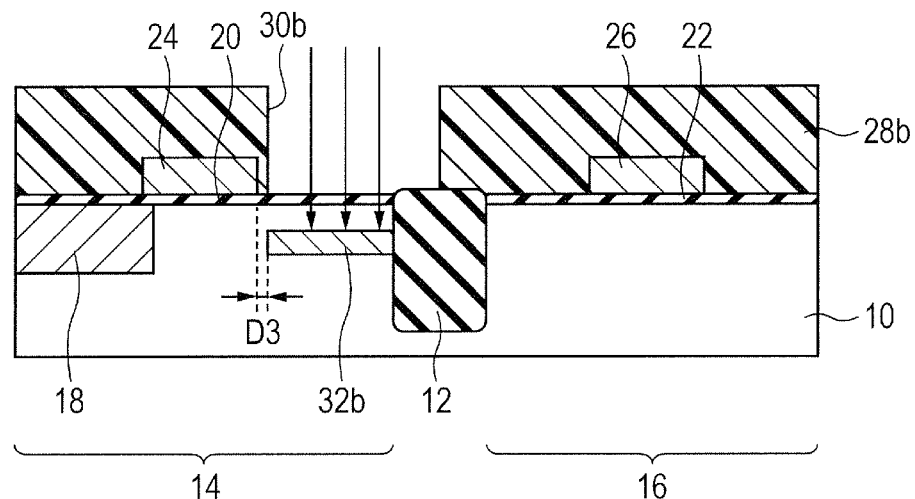
FIGS. 5A and 5B are cross-sectional views illustrating a method of manufacturing the photoelectric conversion device according to the third embodiment of the present invention.
Figure 5B:
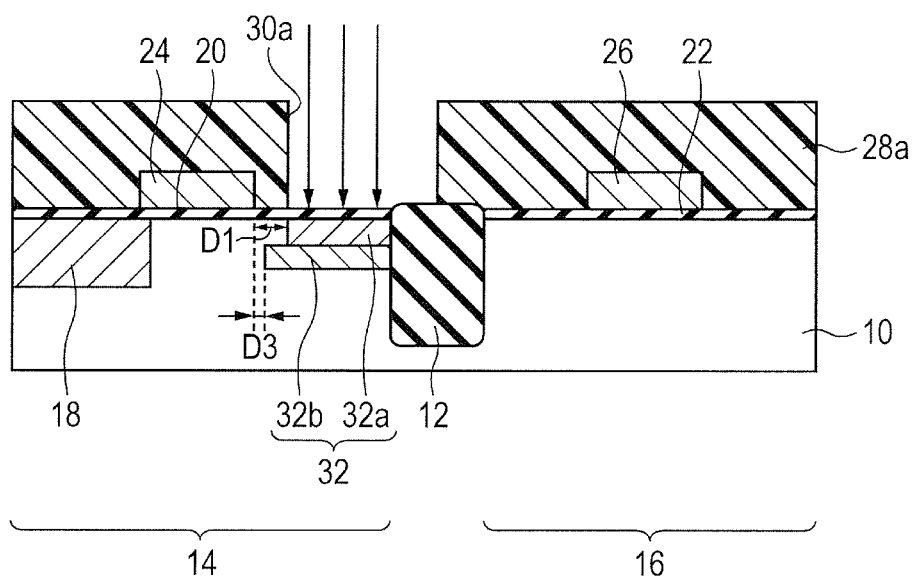

As illustrated in FIG. 4, the photoelectric conversion device according to the present embodiment is substantially the same as the photoelectric conversion device according to the first embodiment illustrated in FIG. 1 except that a structure of the floating diffusion region differs. In the photoelectric conversion device according to the present embodiment, the floating diffusion region 32 is formed by two diffusion regions 32a and 32b having different depths. The diffusion region 32a is formed in a surface portion of the semiconductor substrate 10. The diffusion region 32b is connected to the diffusion region 32a and is formed at a position deeper than the diffusion region 32a. It is assumed that a separation distance between the gate electrode 24 of the transfer transistor and the diffusion region 32a when viewing as a plan view is equal to D1 and a separation distance between the gate electrode 24 of the transfer transistor and the diffusion region 32b when viewing as a plan view is equal to D3. There is a relation of (D1>D3) between the separation distance D1 and the separation distance D3.

Generally, the larger the separation distance D1 is, the more the transfer performance deteriorates and, the smaller the separation distance D1 is, the more electric field concentration between the gate electrode 24 of the transfer transistor and the floating diffusion region 32 becomes remarkable. With respect to such a point, according to the structure of the present embodiment, by changing a position of an edge portion of the floating diffusion region 32 on the gate side of the transfer transistor in the depth direction, the electric field concentration between the gate electrode 24 and the floating diffusion region 32 can be reduced without deteriorating the transfer performance. Particularly, since an electric field of the portion (portion 60 surrounded by a broken line in FIG. 4) near the gate insulating film 20 in the edge portion of the gate electrode 24 of the transfer transistor is reduced, the deterioration of the gate insulating film 20 is suppressed, and the reliability to the insulating performance of the relevant portion can be maintained. Thus, in a manner similar to the case of the photoelectric conversion device according to the first embodiment, both of the reduction of a dark current which flows into the photodiode and the reduction of the charges which leak into the adjacent pixel can be accomplished.

A relation with the peripheral transistor is similar to that in the first embodiment. In the photoelectric conversion device, by setting the relation of (D1>D2), the leakage into the adjacent pixel can be suppressed while maintaining the reliability of the gate insulating film 20 of the transfer transistor. Further, the reliability of the gate insulating film 22 can be improved without remarkably reducing the operating speed of the peripheral transistor.

Subsequently, a method of manufacturing the photoelectric conversion device according to the present embodiment will be described with reference to FIGS. 5A and 5B.

First, in a manner similar to the manufacturing method of the first embodiment illustrated in FIGS. 2A to 2C, the element isolation insulating region 12, the charge accumulation region 18, the gate insulating films 20 and 22, and the gate electrodes 24 and 26 are formed in/over the semiconductor substrate 10.

Subsequently, a photoresist pattern 28b having an opening 30b formed in the forming region of the floating diffusion region 32 is formed by photolithography. At this time, it is assumed that the photoresist pattern 28b has such a shape that it covers the whole upper portion of the gate electrode 24 of the transfer transistor and an edge portion of the opening 30b on the gate electrode 24 side is away from the gate electrode 24 by a predetermined distance.

Subsequently, ion implantation is performed by using the photoresist pattern 28b as a mask to form the diffusion region 32b (FIG. 5A). Thus, the separation distance D3 between the gate electrode 24 of the transfer transistor and the diffusion region 32b is decided by the separation distance (foregoing predetermined distance) between the edge portion of the opening 30b on the gate electrode 24 side and the gate electrode 24. After the diffusion region 32b is formed, the photoresist pattern 28b is removed by ashing or the like.

Subsequently, a photoresist pattern 28a having an opening 30a formed in the forming region of the floating diffusion region 32 is formed by photolithography. At this time, it is assumed that the photoresist pattern 28a has such a shape that it covers the whole upper portion of the gate electrode 24 of the transfer transistor and an edge portion of the opening portion 30a on the gate electrode 24 side is away from the gate electrode 24 by a predetermined distance.

Subsequently, an ion implantation is performed by using the photoresist pattern 28a as a mask to form the diffusion region 32a (FIG. 5B). Thus, the separation distance D1 between the gate electrode 24 of the transfer transistor and the diffusion region 32a is decided by the separation distance (foregoing predetermined distance) between the edge portion of the opening 30a on the gate electrode 24 side and the gate electrode 24. After the diffusion region 32a is formed, the photoresist pattern 28a is removed by ashing or the like.

Also by using the manufacturing method of the third embodiment, the transfer transistor and the peripheral transistor having the relation of (D1>D2) and the relation of ($Nd_1 < Nd_2$) can be formed. Therefore, according to the present embodiment, the transistor of the peripheral circuit portion which can suppress a leakage into the adjacent pixel and can perform the high-speed operation while maintaining the reliability of the gate insulating film of the transfer transistor can be used.

[Modifications]

The present invention is not limited to the foregoing embodiments but many various modifications are possible.

For example, the floating diffusion region 32 and the drain region 44 which are away from the gate electrode have been formed by performing the ion implantation by providing the offset by the photoresist pattern in the first embodiment and have been formed by using the oblique ion implantation in the second embodiment. However, those methods can be also arbitrarily combined. For example, the floating diffusion region 32 may be formed by performing the ion implantation by providing the offset by the photoresist pattern and the drain region 44 may be formed by performing the oblique ion implantation. Or, the drain region 44 may be formed by performing the ion implantation by providing the offset by the photoresist pattern, and the floating diffusion region 32 may be formed by performing the oblique ion implantation.

The structure of the charge accumulation region 18 is not limited to the structure disclosed in the above embodiments. For example, if the charge accumulation region 18 is one diffusion region of the photodiode, a buried photodiode in which a diffusion layer of an opposite conductivity type is arranged on the surface side of the semiconductor substrate 10 than the charge accumulation region 18 may be used.

In the foregoing third embodiment, the floating diffusion region 32 formed of the diffusion regions 32a and 32b are formed by using the two photoresist patterns 28a and 28b in which the offset amounts from the gate electrode 24 differ. However, the oblique ion implantation can be also used. For example, the same photoresist pattern and gate electrode are used as a mask, the diffusion region 32a can be formed by the ion implantation of a large tilt angle, and the diffusion region 32b can be formed by the ion implantation of a small tilt angle.

Although the source region 38 and the drain region 44 of the peripheral transistor are individually formed in the foregoing embodiments, they may be simultaneously formed. For example, if opening portions corresponding to the openings 36 and 42 can be simultaneously formed in one photoresist pattern, this photoresist pattern is used as a mask and the source region 38 and the drain region 44 can be simultaneously formed. In the second embodiment, if such a situation that the source region 38 largely creeps under the gate electrode 26 of the source region 38 can be ignored, the source region can be formed by the oblique ion implantation simultaneously with the drain region 44.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-031380, filed on Feb. 20, 2015, which is hereby incorporated by reference herein in its entirety.

What is claimed is:

1. A photoelectric conversion device comprising:
a pixel including a transfer transistor transferring signal charges generated in a photoelectric conversion portion from a charge accumulation region to a floating diffusion region; and
a peripheral transistor forming a peripheral circuit for controlling a read-out operation of a pixel signal based on the signal charges from the pixel,
wherein a gate electrode of the transfer transistor and the floating diffusion region are separated from each other by a first distance in a plan view, and
a gate electrode and a drain region of the peripheral transistor are separated from each other by a second distance smaller than the first distance in a plan view.

2. The photoelectric conversion device according to claim 1, wherein
an impurity concentration of the floating diffusion region is not more than an impurity concentration of the drain region.

3. The photoelectric conversion device according to claim 1, wherein
the floating diffusion region includes a first diffusion region provided at a first depth and a second diffusion region provided at a second depth deeper than the first depth;
the gate electrode of the transfer transistor and the first diffusion region are separated from each other by the first distance in a plan view; and
the gate electrode of the transfer transistor and the second diffusion region are separated from each other by a third distance smaller than the first distance in a plan view.

4. A method of manufacturing a photoelectric conversion device including a pixel including a transfer transistor transferring signal charges generated in a photoelectric conversion portion from a charge accumulation region to a floating diffusion region, and a peripheral transistor forming a peripheral circuit for controlling a read-out operation of a pixel signal based on the signal charges from the pixel, comprising:
forming a gate electrode of the transfer transistor and a gate electrode of the floating diffusion region over a semiconductor substrate;
forming the floating diffusion region in the semiconductor substrate so as to be separated from the gate electrode of the transfer transistor by a first distance in a plan view; and
forming a drain region of the peripheral transistor in the semiconductor substrate so as to be separated from the gate electrode of the peripheral transistor by a second distance smaller than the first distance in a plan view.

5. The method of manufacturing a photoelectric conversion device according to claim 4, wherein
in forming the floating diffusion region, the gate electrode of the transfer transistor and the floating diffusion region are separated from each other by the first distance in a plan view by performing ion implantation with providing an offset from the gate electrode by a mask.

6. The method of manufacturing a photoelectric conversion device according to claim 4, wherein
in forming the floating diffusion region, the gate electrode of the transfer transistor and the floating diffusion region are separated from each other by the first distance in a plan view by performing oblique ion implantation by using the gate electrode as a mask.

7. The method of manufacturing a photoelectric conversion device according to claim 4, wherein
forming the floating diffusion region includes
forming, at a first depth, a first diffusion region separated from the gate electrode of the transfer transistor by the first distance in a plan view; and
forming, at a second depth deeper than the first depth, a second diffusion region separated from the gate electrode of the transfer transistor by a third distance smaller than the first distance in a plan view.

* * * * *